(12) United States Patent
Lee et al.

(10) Patent No.: US 10,297,772 B2
(45) Date of Patent: May 21, 2019

(54) DISPLAY DEVICE AND MANUFACTURING METHOD THEREOF

(71) Applicant: Samsung Display Co., Ltd., Yongin-si, Gyeonggi-do (KR)

(72) Inventors: Jung Kyu Lee, Incheon (KR); Tae Hyun Kim, Seoul (KR); Sang Ho Park, Hwaseong-si (KR); Dong Hwan Shim, Hwaseong-si (KR); Seung Min Lee, Hwaseong-si (KR); Seung-Hwan Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 24 days.

(21) Appl. No.: 15/711,121

(22) Filed: Sep. 21, 2017

(65) Prior Publication Data
US 2018/0083211 A1    Mar. 22, 2018

(30) Foreign Application Priority Data
Sep. 22, 2016 (KR) .......................... 10-2016-0121610

(51) Int. Cl.
  *H01L 51/00* (2006.01)
  *H01L 27/32* (2006.01)
  *H01L 51/52* (2006.01)

(52) U.S. Cl.
  CPC ...... *H01L 51/0097* (2013.01); *H01L 27/3246* (2013.01); *H01L 27/3248* (2013.01); *H01L 27/3258* (2013.01); *H01L 27/3276* (2013.01); *H01L 51/5253* (2013.01); *H01L 2227/323* (2013.01); *H01L 2251/5338* (2013.01)

(58) Field of Classification Search
  CPC ............. H01L 51/0097; H01L 27/3276; H01L 51/5253; H01L 27/3246; H01L 27/3248
  See application file for complete search history.

(56) References Cited

U.S. PATENT DOCUMENTS

2016/0181158 A1    6/2016  Hegde
2017/0170206 A1*   6/2017  Lee ..................... H01L 27/1218

FOREIGN PATENT DOCUMENTS

| KR | 1020140122960 A | 10/2014 | |
| KR | 10-2014-0129647 | * 11/2014 | ............. H01L 51/50 |
| KR | 1020140129647 A | 11/2014 | |
| KR | 101493412 B1 | 2/2015 | |

* cited by examiner

*Primary Examiner* — Jay C Chang
*Assistant Examiner* — Mikka Liu
(74) *Attorney, Agent, or Firm* — Cantor Colburn LLP

(57) ABSTRACT

A display device includes: a substrate including a display area, a non-display area at which the image is not displayed and a first area including the display area, the non-display area including a bending area at which the display device is bendable between the first area and a second area; a first wire in the first area, the first wire and connected to the display area; a second wire in the second area; a protection layer in the first, second and bending areas, first and second contact holes in the protection layer and exposing the first and second wires; and a connection wire connected to the first wire, extended from the first area to traverse the bending area and connected to the second wire. The connection wire includes a plurality of conductive layers contacting each other, the plurality of conductive layers including a same material.

11 Claims, 11 Drawing Sheets

DISPLAY DEVICE AND MANUFACTURING METHOD THEREOF

This application claims priority to Korean Patent Application No. 10-2016-0121610 filed on Sep. 22, 2016, and all the benefits accruing therefrom under 35 U.S.C. § 119, the content of which in its entirety is incorporated herein by reference.

BACKGROUND (a) Field

This disclosure relates to a display device and a manufacturing method thereof.

(b) Description of the Related Art

Display devices such as an organic light emitting device and a liquid crystal display device are manufactured by generating a plurality of layers and elements on a substrate. Glass is used for the substrate of the display device. However, the glass substrate is relatively heavy and easily broken. Further, the glass substrate is relatively rigid such that deforming the display device may be difficult. Display devices using a flexible substrate that is relatively light, strong against impacts and easily deformed have been developed.

SUMMARY

The invention has been made in an effort to provide a display device for which reliability of a bending area of a display panel thereof is improved.

An exemplary embodiment of the invention provides a display device including: a substrate including a display area at which an image is displayed, a non-display area at which the image is not displayed, and a first area including the display area, the non-display area including a second area at an end of the substrate and a bending area at which the display device is bendable, the bending area between the first area and the second area; a first wire disposed on the substrate in the first area, the first wire connected to the display area; a second wire disposed on the substrate in the second area, the second wire spaced apart from the first wire in the first area; a protection layer disposed on the first wire in the first area, in the bending area and on the second wire in the second area, a first contact hole and a second contact hole defined in the protection layer and respectively exposing the first wire and the second wire; and a connection wire on the protection layer, the connection wire connected to the first wire in the first area at the first contact hole, such connection wire extended from the first area to traverse the bending area, such extended connection wire connected to the second wire in the second area at the second contact hole. The connection wire includes a plurality of conductive layers contacting each other, the plurality of conductive layers including a same material.

In the first area, the display device may include: a semiconductor disposed on the substrate; a gate insulating layer disposed on the semiconductor; a gate electrode disposed on the gate insulating layer; an inter-layer insulating layer disposed on the gate electrode; and a source electrode and a drain electrode disposed on the inter-layer insulating layer. The protection layer may be disposed on the source electrode and the drain electrode.

The display device may further include a pixel electrode disposed on the protection layer in the first area.

The gate insulating layer and the inter-layer insulating layer may be excluded from the bending area to expose a portion of the substrate in the bending area, the protection layer may contact the exposed portion of the substrate in the bending area, and the connection wire may be extended from the first area traverses the protection layer which contacts the exposed portion of the substrate in the bending area.

The display device may further include a pixel definition layer disposed on the protection layer in the first area and disposed on the protection layer in the bending area. The connection wire may be disposed between the protection layer and the pixel definition layer.

The protection layer and the pixel definition layer may include an organic insulating material.

The source electrode and the drain electrode may each include a conductive layer. A grain size within each conductive layer of the connection wire may be smaller than grain sizes of the conductive layer of each of the source electrode and the drain electrode.

The same material of the plurality of conductive layers of the connection wire may be aluminum or copper.

The same material of the plurality of conductive layers of the connection wire may be aluminum with a grain size that is equal to or less than about 100 nanometers.

The same material of the plurality of conductive layers of the connection wire may be copper with a grain size that is equal to or less than about 50 nanometers.

The protection layer may contact the substrate in the bending area.

Another embodiment of the invention provides a method for manufacturing a display device, including: preparing a substrate including a display area at which an image is displayed, a non-display area at which the image is not displayed, and a first area including the display area, the non-display area including a second area at an end of the substrate and a bending area at which the display device is bendable, the bending area disposed between the first area and the second area, depositing a first conductive material in each of the first area, the second area and the bending area, and patterning the same to form: in the first area, a gate electrode of a transistor of the display area and a first wire connected to the display area, and in the second area, a second wire which is spaced apart from the first wire; depositing a first insulating material in each of the first area, the second area and the bending area to form a gate insulating layer within the transistor; depositing a second insulating material in each of the first area, the second area and the bending area to form an inter-layer insulating layer within the transistor, on the first wire and on the second wire; depositing a second conductive material and patterning the same to form a source electrode and a drain electrode of the transistor; depositing a third insulating material on the inter-layer insulating layer, the source electrode and the drain electrode to form a protection layer in each of the first area, the second area and the bending area; and depositing a third conductive material to form a connection wire on the protection layer, such connection wire electrically connecting the first wire and the second wire to each other. The forming of the connection wire includes discontinuously depositing the third conductive material to form a plurality of conductive layers contacting each other, the plurality of conductive layers including a first conductive layer and a second conductive layer which contact each other by the discontinuous deposition.

The forming of the protection layer may include forming contact holes in the protection layer and the inter-layer insulating layer before the forming of the connection wire, the contact holes respectively exposing the first wire and the second wire. The connection wire may be connected to the first wire and the second wire at the contact holes.

The method may further include: forming a pixel electrode on the protection layer; and forming a pixel definition layer including an opening is defined exposing the pixel electrode The connection wire may be disposed between the protection layer and the pixel definition layer in a thickness direction of the display device.

The first and second conductive layers of the connection wire include a same material as each other, the same material including aluminum or copper.

The protection layer may include an organic insulating material.

The forming of the source electrode and the drain electrode may include forming the source and drain electrodes each as a single conductive layer by continuously depositing the second conductive material to form the single conductive layer.

According to one or more exemplary embodiment, the flexibility of the connection wire in the bending area of the display panel may be increased to improve reliability of the bending area, and reduce or effectively prevent the electrical characteristics of the display panel from being deteriorated.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
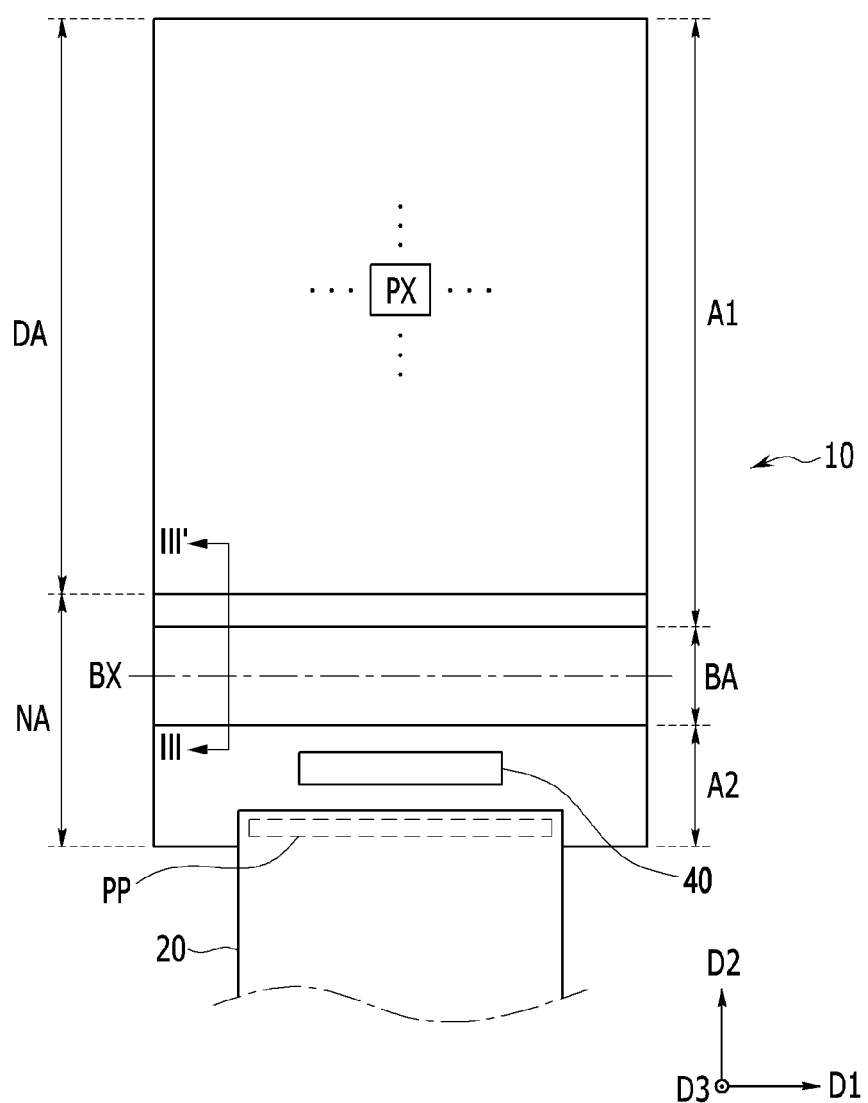
FIG. 1 shows a top plan view of a display device in an unbent state thereof, according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

The drawings and description are to be regarded as illustrative in nature and not restrictive, and like reference numerals designate like elements throughout the specification.

The size and thickness of each component shown in the drawings are arbitrarily shown for better understanding and ease of description, but the invention is not limited thereto. In the drawings, the thickness of layers, films, panels, regions, etc., are exaggerated for clarity. For better understanding and ease of description, the thickness of some layers and areas is exaggerated.

It will be understood that when an element such as a layer, film, region, or substrate is referred to as being related to another element such as being "on" another element, it can be directly on the other element or intervening elements may also be present. In contrast, when an element is referred to as being related to another elements such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A display device using a flexible substrate may be designed to bend such that a display panel of the display device is deformed at a bending area of the display panel. The display panel may be bent at an edge portion or end portion thereof. A pad portion to which a flexible printed circuit film ("FPC") for transmitting signals may be disposed at the edge portion or end portion of the display panel, thereby reducing a dead space within the display device as compared to a display device using a relatively inflexible (e.g., rigid substrate). When the dead space within the display device is reduced, a bezel width of the display device may be reduced to maximize usage of an inner space of the display device so the display device may be manufactured to be further compact.

However, conductive wires or signal wires disposed in the bending area of the display panel may be degraded or cut by the bending of the display panel.

An exemplary embodiment of a display device according to the invention will now be described in detail with reference to accompanying drawings.

Figure 2:
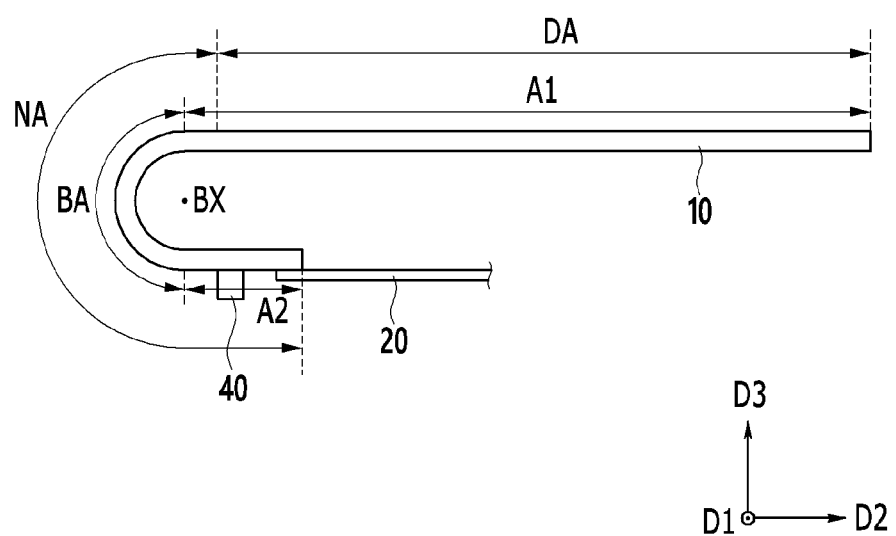
FIG. 2 shows a cross-sectional side view of the display device of FIG. 1 in a bent state thereof, according to the invention.

FIG. 1 shows a top plan view of an exemplary embodiment of a display device in an unbent state thereof, according to the invention is bent, and FIG. 2 shows a cross-sectional side view of the display device of FIG. 1 in a bent state thereof, according to the invention.

Referring to FIG. 1, the display device includes a display panel 10 and a flexible printed circuit film 20 which is connected to the display panel 10.

The display panel 10 includes layers and/or elements for displaying an image disposed or formed on a flexible substrate. The display panel 10 and the flexible substrate thereof includes a display area (DA) at which the image is displayed, and a non-display area (NA) which is provided outside the display area (DA) and at which the image is not displayed. In the non-display area (NA), elements and/or conductive wires for generating and/or transmitting various signals applied to the display area (DA) are disposed. In the top plan view, FIG. 1 shows that a lower area of the display panel 10 is indicated as the non-display area (NA), however, the invention is not limited thereto. In another exemplary embodiment, a right edge, a left edge, and/or an upper edge of the display panel 10 may correspond to the non-display area (NA).

A pixel PX is disposed in the display area (DA) of the display panel 10. As indicated by the extended dotted line from "PX" in FIG. 1, a plurality of the pixel PX is in the display area (DA) of the display panel 10, such as in a matrix form in the top plan view. Signal lines such as gate lines (not shown) or data lines (not shown) are disposed in the display area (DA). The gate lines may define lengths thereof which are larger than widths thereof and mainly extend in a first direction D1 (e.g., a row direction), and the data lines may define lengths thereof which are larger than widths thereof and mainly extend in a second direction D2 (e.g., a column direction) which crosses the first direction D1. Each pixel PX may be connected to a gate line and a data line among the gate lines and data lines, to receive a gate signal and a data signal from the same signal lines, respectively. In the case of the organic light emitting device, for example, driving voltage lines (not shown) lengthwise extending in the second direction D2 and transmitting a driving voltage to the pixels PX may be disposed in the display area (DA).

The display area (DA) may include a touch sensor layer (not shown) configured to sense a user's contacting or non-contacting touch to the display panel 10. In the top plan view, a quadrangular display area (DA) is shown, but the invention is not limited thereto. In an exemplary embodiment, the display area (DA) may have various kinds of planar shapes in the top plan view such as a polygon, a circle or an oval in addition to the quadrangle.

A pad portion (PP) of the display panel 10 including pads (not shown) configured to receive driving, control and/or power signals from outside of the display panel 10 is provided in the non-display area (NA) of the display panel 10. The pads of the pad portion (PP) are connected to conductive signal wires disposed in the non-display area (NA). A first end of the flexible printed circuit film 20 is bonded to the pad portion (PP). A second end of the flexible printed circuit film 20 may be exemplarily connected to an external printed circuit board ("PCB") (not shown) to transmit signals such as image data from such external PCB to the display panel 10.

A driving device for generating and/or processing various kinds of signals for driving the display panel 10 may be provided in the non-display area (NA) of the display panel 10, and may be provided on the flexible printed circuit film 20 which is bonded to the pad portion (PP). The driving device in the non-display area (NA) may include a data driver for generating and/or applying a data signal to the data line in the display area (DA), a gate driver for generating and/or applying a gate signal to the gate line in the display area (DA), and a signal controller for controlling the data driver and the gate driver.

The data driver is installed as an integrated circuit chip 40 in the non-display area (NA) of the display panel 10 between the display area (DA) and the pad portion (PP) thereof. In an alternative exemplary embodiment, differing from the drawing, the data driver may be mounted as an integrated circuit chip on the flexible printed circuit film 20 and may be connected as a tape carrier package ("TCP") to the pad portion (PP). The gate driver may be provided as an integrated circuit chip or may be integrated in a non-display area (not shown) on the left/right edge of the display panel 10. The signal controller may be formed with a same integrated circuit chip 40 as the data driver or may be provided as a separate integrated circuit chip.

Referring to FIG. 1 and FIG. 2, the display panel 10 includes a bending area (BA) between the display area (DA) and the pad portion (PP), at which the display panel 10 is bent. As shown in FIG. 2, the bending area (BA) represents an area at which the display panel 10 is bent with a predetermined curvature radius. A length of the bending area (BA) is provided to traverse the display panel 10 in the first direction D1, and a width of the bending area (BA) extends in the second direction D2. The display panel 10 may be bent with respect to a bending axis which lengthwise extends in parallel to the first direction D1. As shown in FIG. 2, in a bent state of the display panel 10, the flexible printed circuit film 20 may be provided behind or under the display area (DA).

Referring to FIG. 2, an example in which the display panel 10 is bent at the bending area (BA) thereof with respect to one bending axis (BX) is shown, but the invention is not limited thereto. In an exemplary embodiment, the display panel 10 may be bent at the bending area (BA) thereof with respect to a plurality of bending axes. In the drawing, the bending area (BA) is shown to be provided in the non-display area (NA), but the invention is not limited thereto. In an exemplary embodiment, the bending area (BA) of the display panel 10 may be provided in the display area (DA) and in the non-display area (NA) thereof, or only in the display area (DA) thereof.

Conductive wires for transmitting the signals that are input through the pads of the pad portion (PP) to the driving device or to the display area (DA) are provided in the bending area (BA). With respect to the bending area (BA), the display panel 10 includes a first area A1 provided on and extended from a first side of the bending area (BA) and a second area A2 provided on and extended from a second side of the bending area (BA) which is opposite to the first area A1 thereof. The first area A1, the bending area (BA) and the second area A2 are continuously provided. In an exemplary embodiment, the first area A1, the bending area (BA) and the second area A2 are sequentially provided to be respectively adjacent to each other. As illustrated in FIG. 1, the first area A1, the bending area (BA) and the second area A2 may occupy a planar area of the display panel 10 defined by an entire width of the display panel 10 in the first direction D1 taken along an entire length of the display panel 10. The non-display area (NA) may be a planar area of the display panel 10 except for the display area (DA), but the invention is not limited thereto.

The first area A1 may include the display area (DA). The integrated circuit chip 40 and the pad portion (PP) may be provided in the second area A2. In the illustrated exemplary embodiment, the non-display area (NA) includes not only the bending area (BA), but also portions of the first area A1 and the second area A2 disposed adjacent to such bending area (BA). A supporter (not shown) or an adhesive member (not shown) for maintaining a predetermined bent state may be provided between the first area A1 and the second area A2. Referring to FIG. 2, for example, the supporter or adhesive member may be provided between the first and second areas A1 and A2 to maintain the bent state of the display panel 10.

Conducive connection wires (not shown) for connecting conductive wires (not shown) disposed in the first area A1 and conductive wires (not shown) disposed in the second area A2, are disposed in the bending area (BA). The connection wires may be disposed to traverse the bending area (BA). In an exemplary embodiment, for example, in the top plan view, the conductive connection wires may lengthwise extend substantially in parallel to the second direction D2 or may be lengthwise extended in an oblique manner with respect to the second direction. In the unbent state of the display panel 10, the connection wires are also disposed in an unbent state in the bending area (BA). When the display panel 10 is bent at the bending area (BA) thereof, the connection wires are disposed in a bent state at the bending area (BA. The connection wires may include or be made of a metal with excellent flexibility. When the flexibility of the connection wires increases, a stress from a strain decreases so the risk of such connection wires being degraded or broken from the bending thereof may be reduced.

The configuration of the display device has been described. A structure of a display panel 10 will now be described by exemplifying an organic light emitting device with reference to the bending area (BA) as well as the pixel PX of the display panel 10.

Figure 3:
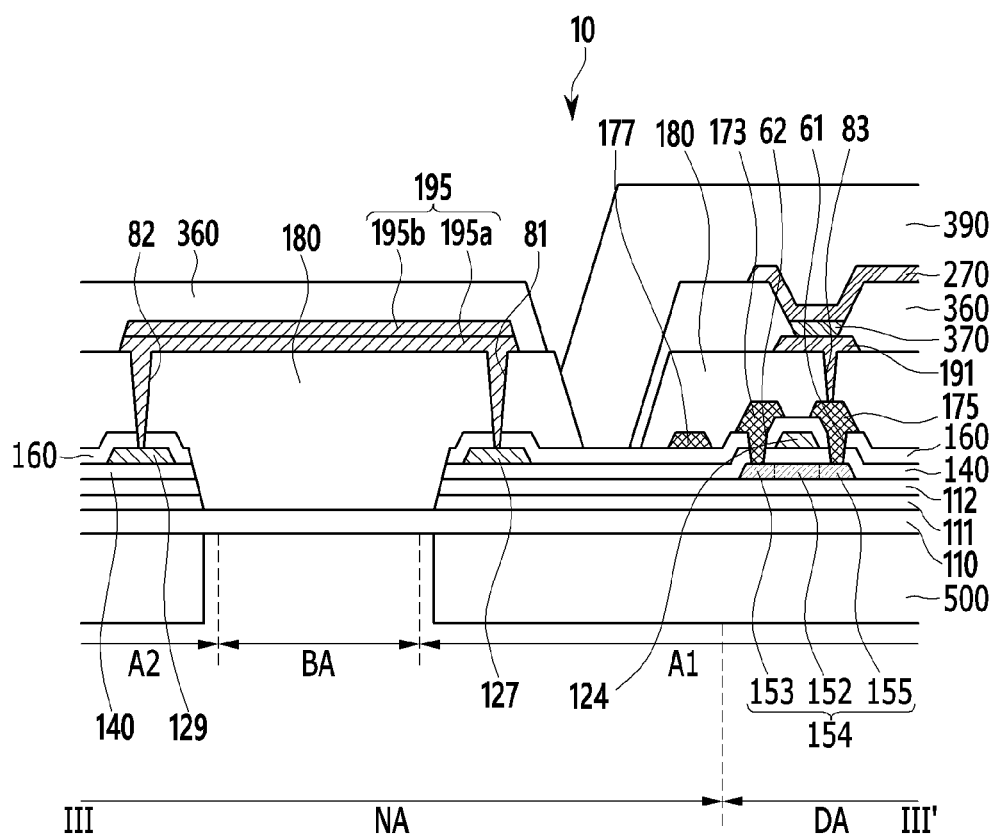
FIG. 3 shows a cross-sectional view of a display panel with respect to line in FIG. 1.
Figure 4:
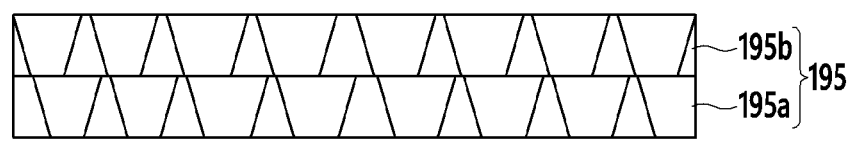
FIG. 4 shows a grain structure of an exemplary embodiment of a connection wire of a display panel according to the invention.
Figure 5:
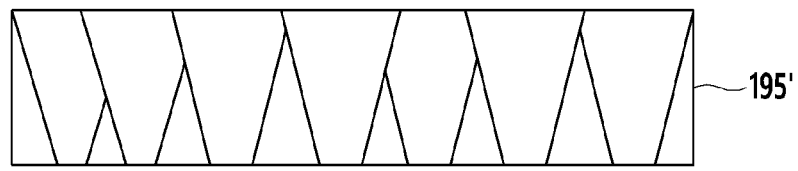
FIG. 5 shows a grain structure of a connection wire of a display panel according to a comparative example.

FIG. 3 shows a cross-sectional view of a display panel with respect to line III-III' in FIG. 1, FIG. 4 shows a grain structure of an exemplary embodiment of a connection wire of a display panel according to the invention, and FIG. 5 shows a grain structure of a connection wire according to a comparative example.

Referring to FIG. 3, the display panel 10 includes a flexible substrate 110 and a plurality of layers and elements disposed or formed thereon. A pixel (PX in FIG. 1) may be disposed in plurality in the display area (DA) of the display panel 10. To avoid complexity of the drawing, one pixel PX will be illustrated and described with respect to FIG. 3. Further, each pixel PX includes a transistor and an organic light emitting diode. The configuration of the display panel 10 will now be described with a focus on one transistor and one organic light emitting diode connected thereto.

The flexible substrate 110 may include or be made of a polymer such as a polyimide, a polyamide, a polycarbonate or a polyethylene terephthalate, and is not limited thereto.

A barrier layer 111 and a buffer layer 112 for reducing or effectively preventing the spread of impurities which degrade a semiconductor characteristic and reducing or effectively preventing permeation of moisture are disposed on the flexible substrate 110. The barrier layer 111 and the buffer layer 112 may each include an inorganic insulating material such as a silicon oxide (SiOx) or a silicon nitride (SiNx). The barrier layer 111 and a buffer layer 112 in the display area (DA) may be extended to be disposed in the non-display area (NA). The barrier layer 111 and the buffer layer 112 may be each disposed on an entirety of the flexible substrate 110, except for the bending area (BA). The barrier layer 111 and the buffer layer 112 are omitted in the bending area (BA) because the inorganic insulating material thereof is relatively weak when exposed to a deformation or bending force. As such a layer including such inorganic insulating material may be cracked or may be damaged by conductive wires disposed in the bending area (BA). In an exemplary embodiment, one of the barrier layer 111 and the buffer layer 112 may be omitted.

A semiconductor (layer) 154 of a transistor is disposed on the buffer layer 112. The semiconductor 154 collectively includes or is defined by a channel region 152, and a source region 153 and a drain region 155 which are disposed on respective opposing sides of the channel region 152 and doped such as with an impurity. The semiconductor 154 may include polysilicon, amorphous silicon or an oxide semiconductor.

A gate insulating layer 140 including an inorganic insulating material such as a silicon oxide or a silicon nitride is disposed on the semiconductor 154. The gate insulating layer 140 in the display area (DA) may be extended to be disposed in the non-display area (NA). The gate insulating layer 140 may not be disposed in (e.g., excluded or omitted from) the bending area (BA).

A gate conductor including a gate line (not shown), a gate electrode 124 of the transistor, a first wire 127 and a second wire 129 is disposed on the gate insulating layer 140. The gate conductor may include a metal such as molybdenum (Mo), copper (Cu), aluminum (Al), silver (Ag), chromium (Cr), tantalum (Ta) or titanium (Ti), or a metal alloy. In the top plan view, the gate electrode 124 may overlap or be overlapped by the channel region 152 of the semiconductor 154. The first wire 127 may be connected to the display area (DA) (e.g., to signal lines such as a data line or a driving voltage line) and the driving device (e.g., to conductive lines within a gate driver). The second wire 129 may be connected to the integrated circuit chip 40 and the pad of the pad portion (PP).

An inter-layer insulating layer 160 is disposed on the gate insulating layer 140 and the gate conductor. The inter-layer insulating layer 160 may include an inorganic insulating material such as a silicon oxide, a silicon nitride, a silicon oxynitride (SiON) or a silicon oxyfluoride (SiOF). The inter-layer insulating layer 160 in the display area (DA) may be extended to be disposed in the non-display area (NA). The inter-layer insulating layer 160 may not be disposed in (e.g., excluded or omitted from) the bending area (BA).

A data conductor including a data line (not shown), a source electrode 173 and a drain electrode 175 of a transistor and a voltage transmitting line 177 is disposed on the inter-layer insulating layer 160. The voltage transmitting line 177 may transmit a power supply voltage such as a driving voltage or a common voltage. The source electrode 173 and the drain electrode 175 may be connected to the source region 153 and the drain region 155 of the semiconductor 154 at contact holes 61 and 62 defined or formed in the inter-layer insulating layer 160 and the gate insulating layer 140, respectively The data conductor may exemplarily include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr) or tantalum (Ta), or a metal alloy. The data conductor may not be disposed in (e.g., excluded or omitted from) the bending area (BA).

An auxiliary layer (not shown) for improving a contact characteristic of the data conductor may be disposed at a bottom portion of the data conductor. A capping layer (not shown) for reducing or effectively preventing oxidization of the data conductor may be disposed at a top portion of the data conductor. The auxiliary layer and the capping layer may exemplarily include titanium (Ti), chromium (Cr), molybdenum (Mo), or tantalum (Ta), and they may include or be made of a material that is different from that of the data conductor.

The gate electrode 124, the source electrode 173 and the drain electrode 175 configure a transistor together with the semiconductor 154. The illustrated transistor may be a driving transistor in the pixel of the organic light emitting device. Regarding the illustrated transistor, the gate electrode 124 is disposed above the semiconductor 154 so as to illustrate as a top-gate transistor. The structure of the transistor is not limited thereto, and for example, the transistor may be a bottom-gate transistor in which the gate electrode is disposed below the semiconductor.

A protection layer 180 is disposed on the inter-layer insulating layer 160 and the data conductor. The protection layer 180 may have a planar surface for increasing light-emitting efficiency of an organic light emitting element to be disposed or formed thereon. The protection layer 180 may be referred to as a planarization layer. The protection layer 180 may include an organic insulating material. The protection layer 180 in the display area (DA) may be extended to be disposed in the non-display area (NA). The protection layer 180 is disposed in the bending area (BA) and is extended from the bending area (BA) to be disposed outside the same. As shown, the protection layer 180 may be disposed to contact the flexible substrate 110. A portion of the flexible substrate 110 is exposed at the bending area (BA) since the barrier layer 111, the buffer layer 112, the gate insulating layer 140 and the inter-layer insulating layer 160 that may include an inorganic insulating material, are not disposed in the bending area (BA). As such, the exposed portion of the flexible substrate 110 is contacted by the protection layer 180 at the bending area (BA). The barrier layer 111, the buffer layer 112, the gate insulating layer 140 and the inter-layer insulating layer 160 may each include an opening and such openings are aligned with each other to form a collective opening which exposes the portion of the flexible substrate 110.

A pixel electrode 191 is disposed on the protection layer 180 in the display area (DA). The pixel electrode 191 of a pixel may be connected to the drain electrode 175 of the transistor at a contact hole 83 defined or formed in the protection layer 180. The pixel electrode 191 may include or be made of a reflective conductive material, a semi-reflective conductive material or a transparent conductive material.

A conductive connection wire 195 is disposed on the protection layer 180 in the bending area (BA). The connection wire 195 is connected to the first wire 127 and the second wire 129 in the first area A1 and in the second area A2 at contact holes 81 and 82 defined or formed in the protection layer 180 and the inter-layer insulating layer 160. Therefore, the first wire 127 and the second wire 129 that are gate conductors are electrically connected to each other by the connection wire 195. By this, the signal output by the integrated circuit chip 40 or the pad may be transmitted to the display area (DA) or the driving device through the second wire 129, the connection wire 195 and the first wire 127 connected to each other.

The connection wire 195 collectively includes a plurality of layers. In an exemplary embodiment, for example, the connection wire 195 includes a first (conductive) metal layer 195a and a second (conductive) metal layer 195b contacting each other. The first metal layer 195a and a second metal layer 195b include or are made of a same material. In an exemplary embodiment of manufacturing a display panel, the first metal layer 195a and the second metal layer 195b may be formed by discontinuous deposition of a same conductive material (this formation method will be described in a later part of the specification), and an interface which effectively delineates the first metal layer 195a and the second metal layer 195b is present between such layers. The second metal layer 195b is stacked on the first metal layer 195a. The connection wire 195 is shown to include the two metal layers 195a and 195b, but the invention is not limited thereto. The connection wire 195 may include three to six (conductive) metal layers including or made of the same material, or may include more than six metal layers.

When the connection wire 195 is configured as a plurality of metal layers including or made of the same material, a grain size thereof may be smaller than the case in which a connection wire is configured as a single metal layer having a same or uniform cross-sectional thickness. In an exemplary embodiment, for example, FIG. 4 shows for a plurality of metal layers including or made of the same material, a relatively small grain size of a connection wire 195 for each of the first metal layer 195a and the second metal layer 195b In contrast, for a single metal layer of a conventional connection wire, FIG. 5 shows a relatively large grain structure of a connection wire 195' made of only one metal layer.

Since the overall volume of a connection wire is based on an overall thickness thereof, the connection wire 195 including a plurality of metal layers includes a greater number of grains per volume than that of the connection wire 195' made of a single metal layer of a single or same thickness. The grain size may be measured by using, for example, X-ray diffraction ("XRD") analysis or electron backscattered diffraction ("EBSD") analysis, and is not limited thereto.

In one or more embodiment of the invention, the conductive connection wire 195 may exemplarily include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr) or tantalum (Ta), or a metal alloy. The size of the grains within the connection wire 195 may be different depending on the metal. When the connection wire 195 has an overall thickness of about 3000 angstroms and is configured with a plurality of metal layers of aluminum (Al), the grain size within an individual one of those layers measured by photographing a cross-section of the metal layer with a scanning electron microscope ("SEM") may be equal to or less than about 100 nanometers. When the connection wire 195 has an overall thickness of about 3000 angstroms and is configured with a plurality of metal layers made of copper (Cu), the grain size within an individual one of those layers measured by photographing a cross-section of the metal layer with the SEM may be equal to or less than about 50 nanometers. The grain size may become even smaller as the number of metal layers increases within the connection wire 195 having a predetermined thickness.

According to the Hall-Petch theory, flexibility of a metal wire increases when the grain size therein is reduced, as follows:

Yield Strength $\propto$ (Grain Size)$^{-0.5}$.

According to an exemplary embodiment of the invention, the connection wire 195 includes or is formed with a plurality of metal layers of the same material so a grain size within an individual one of the layers is smaller than that of the connection wire 195' formed of a single metal layer. The flexibility of the connection wire 195 resultantly increases, thereby increasing the bending resistance of the connection wire 195 and improving the bending characteristic of the bending area (BA) in which such connection wire 195 is disposed. In considering a bending of the connection wire 195 of FIG. 4, such as suggested in the bent state illustrated in FIG. 2, locations along the thickness of an individual metal layer are applied with different tensile stresses. A smaller grain size may be advantageous at positions along the thickness to which a relatively larger tensile stress is applied, such as position being further in the upward direction within each metal layer of a plurality of metal layers of the connection wire 195. As the smaller grain size is positioned more upward in the metal layer, more tensile stress may be applied thereto by bending of the connection wire 195 such that the flexibility of the connection wire 195 to process the larger tensile state increases.

When a wire is formed to be a plurality of metal layers with the same material, the flexibility of such wire increases as described above, but the electrical resistance thereof may also increase. Therefore, when the wires (e.g., a data conductor) disposed on the display panel 10 are disposed or formed to be a plurality of metal layers with a same material, display quality may be deteriorated by generation of a luminance difference at a light emitting area of the display panel 10 because of the increase of electrical resistance. According to one or more exemplary embodiment of the invention, the connection wire 195 disposed in the bending area (BA) may include or be formed to be a plurality of metal layers such as by discontinuous deposition for increasing flexibility, and the conductive element, electrode or signal wires disposed in other areas of the display panel 10 except for the bending area (BA) may include or be formed to be a single metal layer such as by continuous deposition for an excellent electrical characteristic having decreased electrical resistance.

The connection wire 195 may include or be formed with a same material as the data conductor, or may include or be formed with other materials. An auxiliary layer (not shown) for improving a contact characteristic of the connection wire 195 may be disposed on a lower portion of the connection wire 195, for example, at layer 195a, and a capping layer (not shown) for reducing or effectively preventing oxidation of the connection wire 195 may be disposed on an upper portion of the connection wire 195, for example, at layer 195b, but the invention is not limited thereto. The auxiliary layer and the capping layer may exemplarily include titanium (Ti), chromium (Cr), molybdenum (Mo) or tantalum (Ta), and may be made of a material that is different from the connection wire 195.

Referring back to FIG. 3, a pixel definition layer 360 including an opening therein overlapping the pixel electrode 191 in the top plan view, is disposed on the protection layer 180. The opening of the pixel definition layer 360 may define a pixel area (not shown) of a pixel in the display area (DA). The pixel definition layer 360 may include an organic insulating material. The pixel definition layer 360 in the display area (DA) may extend to the non-display area (NA). The pixel definition layer 360 is disposed on the protection layer 180 and the connection wire 195 in the bending area (BA). Therefore, the connection wire 195 may be disposed between the protection layer 180 and the pixel definition layer 360 in a thickness direction of the display panel 10. Referring to FIGS. 1 and 2, the thickness direction is indicated by a third direction D3. The connection wire 195 is surrounded by the protection layer 180 and the pixel definition layer 360 that may include an organic insulating material, so as to reduced or effectively prevent damage to the connection wire 195 when it is bent during bending of the display panel 10.

A light-emitting member 370 is disposed on the pixel electrode 191. The light-emitting member 370 may include a first organic common layer, an emission layer and a second organic common layer that are sequentially deposited. The first organic common layer may include at least one of a hole injection layer and a hole transfer layer. The emission layer may include or be made of an organic material for intrinsically displaying light of primary colors such as red, green and blue, and may have a structure in which a plurality of organic material layers for displaying light of different colors are deposited. The second organic common layer may include at least one of an electron transfer layer and an electron injection layer.

A common electrode 270 for transmitting a common voltage may be disposed on the light emitting member 370. The common electrode 270 may be made of a transparent conductive material such as indium tin oxide ("ITO") or indium zinc oxide ("IZO"). The common electrode 270 may include or be formed by thinly depositing a metal such as calcium (Ca), barium (Ba), magnesium (Mg), aluminum (Al) or silver (Ag), to have light permeability. The pixel electrode 191, the light emitting member 370 and the common electrode 270 of a pixel configure a light-emitting device that is an organic light emitting diode.

An encapsulation layer 390 is disposed on the common electrode 270. The encapsulation layer 390 may encapsulate the light emitting member 370 and the common electrode 270 to reduce or effectively prevent permeation of external moisture or oxygen thereto. The encapsulation layer 390 may include at least one layer including an inorganic material, and may further include at least one layer including an organic material. The encapsulation layer 390 in the display area (DA) may be extended to be disposed in the non-display area (NA). The encapsulation layer 390 may not be disposed in (e.g., excluded or omitted from) the bending area (BA). A polarization layer (not shown) for reducing or effectively preventing reflection of external light may be disposed on the encapsulation layer 390. The polarization layer may not overlap (e.g., be excluded or omitted from) the bending area (BA). A bending protection layer (not shown) for releasing tensile stress may be provided on the pixel definition layer 360 in the bending area (BA). The bending protection layer may be referred to as a stress neutralization layer.

A passivation film 500 is disposed below the flexible substrate 110. The passivation film 500 is attached to the flexible substrate 110 such as by an adhesive layer (not shown) including but not limited to a pressure sensitive adhesive ("PSA") or an optically clear adhesive ("OCA"). The passivation film 500 may include or be made of a polymer such as polyethylene terephthalate, polyethylene naphthalate, polyimide or polyethylene sulfide. The passivation film 500 may not be disposed in (e.g., excluded or omitted from) the bending area (BA) so as to reduce the bending stress at such area.

Among insulating layers of a display panel, the display area (DA) may include layers including an inorganic insulating material (hereinafter, inorganic insulating layers) (e.g., 111, 112, 140, 160 and 390) and layers including an organic insulating material (hereinafter, organic insulating layers) 180 and 360. The bending area (BA) may include the organic insulating layers 180 and 360, but does not include the inorganic insulating layers 111, 112, 114, 160 and 390. The insulating layer including inorganic material is relatively easily cracked when bent, and the conductive wires disposed on such layers may be damaged by the cracking of the inorganic insulating layer. The bending area (BA) does not include the inorganic insulating layer, such that the display panel may be bent with a relatively small curvature radius (e.g., several hundreds of micrometers) without damaging or degrading layer or elements of the display panel in the bending area (BA) thereof. Further, regarding the connection wire 195 disposed in the bending area (BA), since the connection wire 195 includes a plurality of layers each having a relatively small grain side to increase flexibility thereof, damage due to bending of the conductive wire 195 may be reduced or effectively prevented.

An exemplary embodiment of a method for manufacturing a display device with a cross-sectional structure shown in FIG. 3 according to the invention will now be described with reference to FIG. 6 to FIG. 10.

FIG. 6 to FIG. 10 respectively show cross-sectional views of processes of an exemplary embodiment of a method for manufacturing a display device according to the invention.

Figure 6:
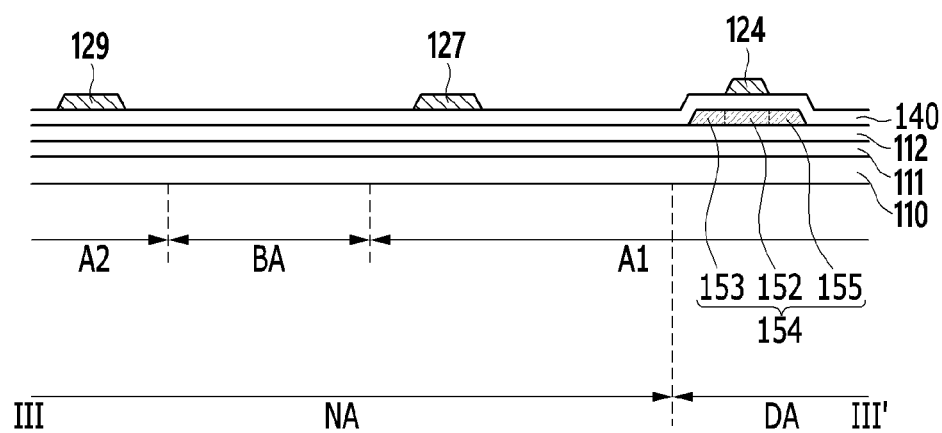
FIG. 6 to FIG. 10 respectively show cross-sectional views of processes of an exemplary embodiment of a method for manufacturing a display device according to the invention.

Referring to FIG. 6, an inorganic insulating material is deposited on the flexible substrate 110 to form a barrier layer 111 and a buffer layer 112, and a semiconductor material is deposited thereon and is patterned to form a semiconductor 154. An inorganic insulating material is deposited on the buffer layer 112 including the semiconductor 154 thereon is formed to form a gate insulating layer 140, and a conductive material such as a metal is deposited thereon and is then patterned to form a gate conductor including a gate electrode 124, a first wire 127 and a second wire 129. Further, a source region 153 and a drain region 155 of the semiconductor 154 are formed by doping an impurity to the semiconductor material.

Figure 7:
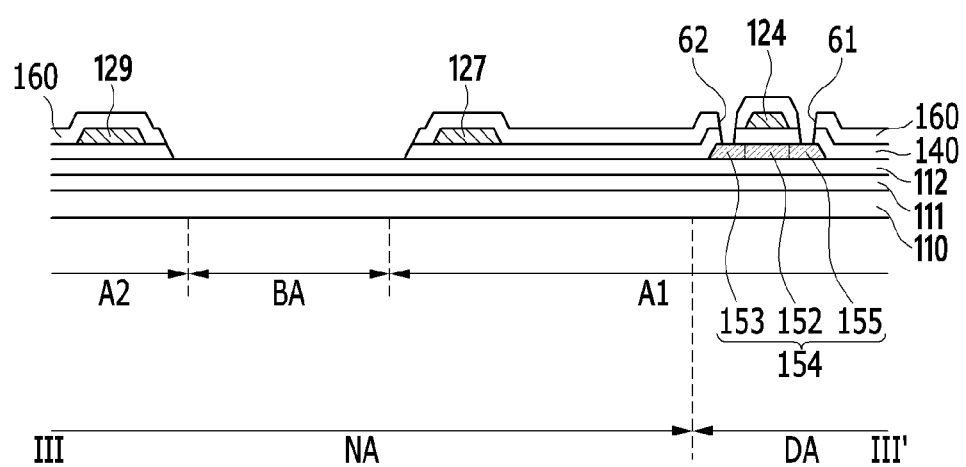

Referring to FIG. 7, an inter-layer insulating layer 160 is formed on the gate insulating layer 140 including the gate conductor thereon. Similar to that shown for the barrier layer 111, the buffer layer 112 and the gate insulating layer 140 in FIG. 6, the inter-layer insulating layer 160 is formed in each of the display area (DA), first area A1, bending area BA and second area A2. The inter-layer insulating layer 160 and the gate insulating layer 140 are then patterned to form contact holes 61 and 62 respectively overlapping the source region 153 and the drain region 155 of the semiconductor 154. When the contact holes 61 and 62 are formed, portions of the inter-layer insulating layer 160 and the gate insulating layer 140 disposed in the bending area (BA) are removed.

Figure 8:
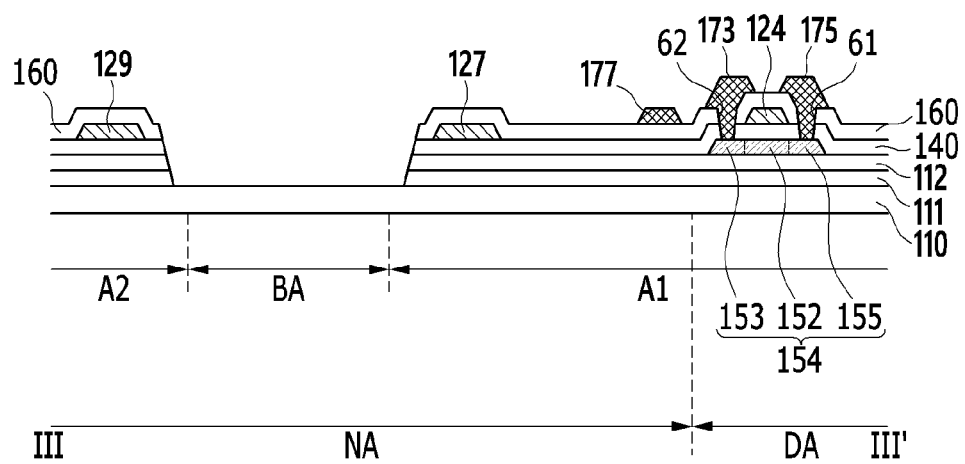

Referring to FIG. 8, portions of the buffer layer 112 and the barrier layer 111 disposed in the bending area (BA) are removed. The removing of the buffer layer 112 and the barrier layer 111 at the bending area (BA) forms an opening in layers 160, 140, 112 and 111 at which the underlying flexible substrate 110 is exposed. Further, a conductive material such as a metal is deposited on the inter-layer insulating layer 160 and is patterned to form a data conductor including a source electrode 173, a drain electrode 175 and a voltage transmitting line 177.

Figure 9:
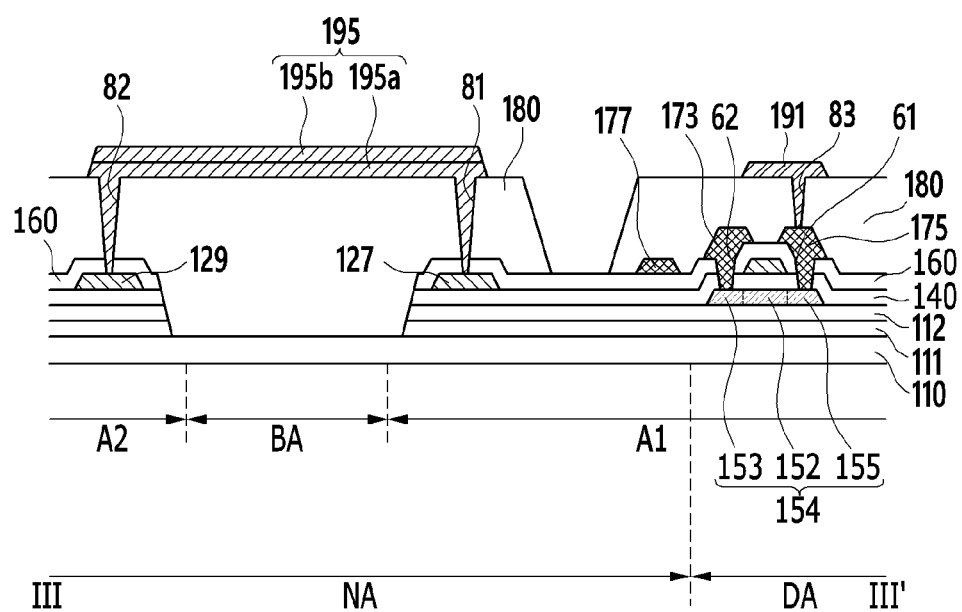

Referring to FIG. 9, the protection layer 180 is deposited and patterned to form a contact hole 83 overlapping the drain electrode 175. Contact holes 81 and 82 overlapping the first wire 127 and the second wire 129 are formed in the protection layer 180 and the inter-layer insulating layer 160, respectively. A metal material is deposited on the protection layer 180 of the bending area (BA) to form a connection wire 195 for connecting the first wire 127 and the second wire 129 to each other at the contact holes 81 and 82. Further, a conductive material is deposited and patterned to form a pixel electrode 191 connected to the drain electrode 175 at the contact hole 83. The pixel electrode 191 may be formed after the connection wire 195 is formed, but may alternatively be formed before the connection wire 195 is formed.

In further detail with respect to formation of the connection wire 195, the connection wire 195 may be formed by a vapor deposition method such as sputtering. In this instance, the connection wire 195 is not formed once by continuous deposition, but a first metal layer 195a is formed in a first deposition, a break is provided in which the first deposition is terminated, and a second metal layer 195b is then formed by a second deposition to be stacked on the previously-formed first metal layer 195a. Such deposition of a same material with at least one break in an overall deposition process to form the connection wire 195 will be referred to as discontinuous deposition. A deposition condition (e.g., time, temperature, etc.) in the forming of the first metal layer 195a may be the same as or different from a deposition condition in the forming of the second metal layer 195b, and the first metal layer 195a and the second metal layer 195b may be formed of the same material.

The first metal layer 195a and the second metal layer 195b that are discontinuous and have an interface defined therebetween are thus formed. In an exemplary embodiment, for example, when a metal layer of a predetermined thickness is formed once by a single continuous deposition, the connection wire 195' of a single layer of a large grain size may be formed as shown in FIG. 5. When the same is formed by discontinuous deposition of multiple deposition processes, the connection wire 195 of multiple layers each having a respectively small grain size may be formed as shown in FIG. 4. Differing from the connection wire 195 of the non-display area (NA), the data conductor of the display area (DA) of the predetermined thickness may be formed by continuous deposition so that the electrical characteristic (particularly, electrical resistance) may not be deteriorated.

Figure 10:
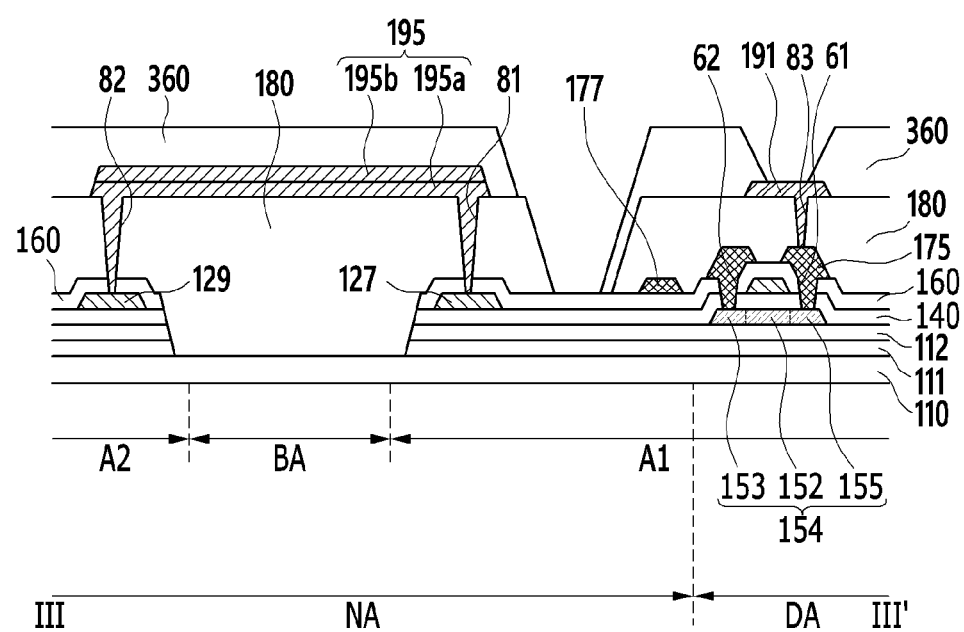

Referring to FIG. 10, a pixel definition layer 360 is formed on the protection layer 180 including the pixel electrode 191 and the connection wire 195 thereon, and then patterned to form an opening overlapping the pixel electrode 191. The pixel definition layer 360 may be formed to cover the connection wire 195. A light emitting member 370, a common electrode 270, and an encapsulation layer 390 are formed and a passivation film 500 is attached thereto to manufacture a display device with a configuration as shown in FIG. 3.

Figure 11:
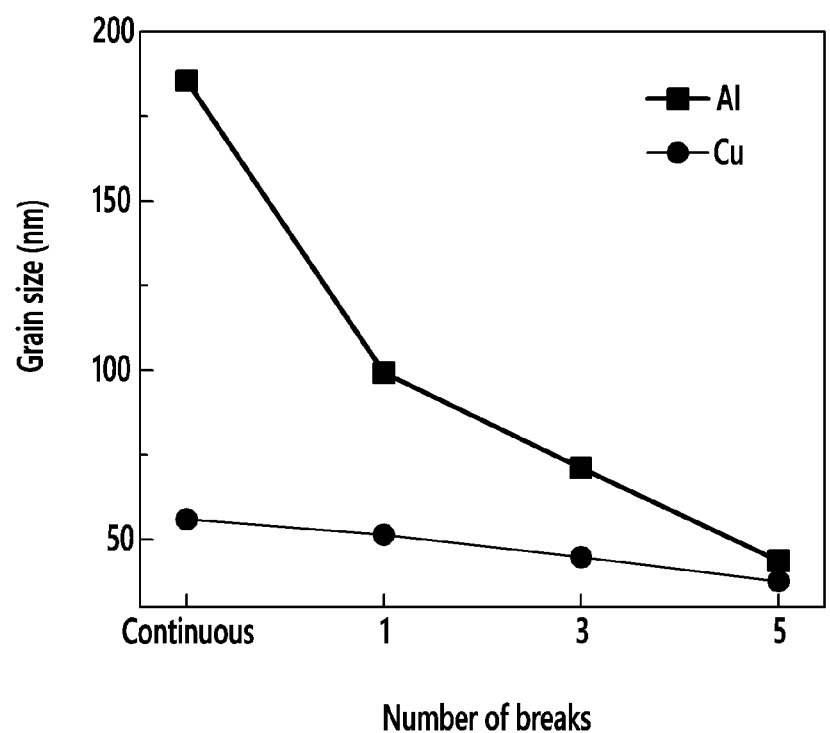
FIG. 11 shows a graph for illustrating a grain size within layers formed by continuous deposition and discontinuous deposition.

As described above, when the connection wire 195 is formed as a collection of a plurality of layers such as by discontinuous deposition, the grain size of within individual layers of the connection wire 195 becomes relatively small. FIG. 11 shows a graph for indicating a grain size (in nm) within layers formed by continuous deposition and discontinuous deposition. The graph indicates grain sizes measured when a copper layer having an overall thickness of 3000 angstroms is formed by performing continuous deposition, discontinuous deposition with 1 break (e.g., 2 deposition processes), discontinuous deposition with 2 breaks, and discontinuous deposition with 5 breaks. The graph also shows the grain size aluminum layers formed in the same conditions. As shown, the grain sizes of the copper layer and the aluminum layer become smaller as the number of breaks in the overall deposition process increases, and the grain size of the aluminum layer is reduced by about half according to discontinuous deposition with 2 breaks as compared to the reduction for the copper layer.

As the grain size within a metal layer becomes smaller, the flexibility of such metal layer increases and the bending resistance of the connection wire 195 including such metal layer increases. Table 1 expresses results of measuring in-folding and out-folding resistance change rates ($R/R_0$) of a copper layer after a number of foldings, after a 2000 angstroms thick SiNx is formed on a 50 micrometers-thick polycarbonate film and the copper layer is formed to be 3000 angstroms in thickness by respectively performing continuous deposition, discontinuous deposition with 1 break, discontinuous deposition with 2 breaks, and discontinuous deposition with 5 breaks.

TABLE 1

| | In-folding resistance change rates | | | | Out-folding resistance change rates | | | |
|---|---|---|---|---|---|---|---|---|
| Number of Foldings | Continuous deposition | Discontinuous deposition with 1 break | Discontinuous deposition with 2 breaks | Discontinuous deposition with 5 breaks | Continuous deposition | Discontinuous deposition with 1 break | Discontinuous deposition with 2 breaks | Discontinuous deposition with 5 breaks |
| 0k | 1.00 | 1.00 | 1.00 | 1.00 | 1.00 | 1.00 | 1.00 | 1.00 |
| 50k | 3.19 | 1.03 | 0.99 | 1.00 | Cut | 3.00 | 1.22 | 1.04 |
| 100k | 3.79 | 1.15 | 0.99 | 1.00 | Cut | 20.72 | 3.05 | 1.05 |
| 150k | 3.86 | 1.17 | 0.98 | 1.00 | Cut | 46.95 | 3.86 | 1.04 |
| 200k | 4.01 | 1.35 | 1.01 | 1.00 | Cut | 169.89 | 9.73 | 1.05 |

As expressed in Table 1, resistance of the copper layer continuously deposited at the in-folding increases by about three to four times as the number of foldings increases, but the resistance of the discontinuously deposited copper layer changes little. In the case of the out-folding, the continuously deposited copper layer is cut, resistance of the discontinuously deposited copper layer increases by three times to a maximum thereof when folded 50,000 times, and resistance of the discontinuously deposited with 5 breaks copper layer rarely changes when it is folded 200,000 times.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a substrate including a display area at which an image is displayed, a non-display area at which the image is not displayed, and a first area including the display area,
the non-display area including a second area at an end of the substrate, and a bending area at which the display device is bendable, the bending area between the first area and the second area;
a first wire disposed on the substrate in the first area, the first wire connected to the display area;
a second wire disposed on the substrate in the second area, the second wire spaced apart from the first wire in the first area;
a protection layer disposed on the first wire in the first area, in the bending area and on the second wire in the second area, a first contact hole and a second contact hole defined in the protection layer and respectively exposing the first wire and the second wire; and
a connection wire on the protection layer, the connection wire connected to the first wire in the first area at the first contact hole, such connection wire extended from the first area to traverse the bending area, such extended connection wire connected to the second wire in the second area at the second contact hole,
wherein the connection wire includes a plurality of conductive layers contacting each other, the plurality of conductive layers being made of a same material.

2. The display device of claim 1, further comprising in the first area:
a semiconductor disposed on the substrate;
a gate insulating layer disposed on the semiconductor;
a gate electrode disposed on the gate insulating layer;
an inter-layer insulating layer disposed on the gate electrode;
a source electrode and a drain electrode disposed on the inter-layer insulating layer; and
the protection layer disposed on the source electrode and the drain electrode.

3. The display device of claim 2, wherein
the gate insulating layer and the inter-layer insulating layer are excluded from the bending area to expose a portion of the substrate in the bending area,
the protection layer contacts the exposed portion of the substrate in the bending area, and
the connection wire extended from the first area traverses the protection layer which contacts the exposed portion of the substrate in the bending area.

4. The display device of claim 2, further comprising
a pixel electrode disposed on the protection layer in the first area, the pixel electrode connected to the drain electrode.

5. The display device of claim 4, further comprising
a pixel definition layer disposed on the protection layer in the first area and disposed on the protection layer in the bending area,
wherein in the bending area, the connection wire is disposed between the protection layer and the pixel definition layer in a thickness direction of the display device.

6. The display device of claim 5, wherein
the protection layer and the pixel definition layer include an organic insulating material.

7. The display device of claim 5, wherein
the source electrode and the drain electrode each include a conductive layer, and
a grain size within each layer of the plurality of conductive layers of the connection wire is smaller than grain sizes of the conductive layer of each of the source electrode and the drain electrode.

8. The display device of claim 1, wherein
the protection layer contacts the substrate in the bending area.

9. A display device comprising:
a substrate including a display area at which an image is displayed, a non-display area at which the image is not displayed, and a first area including the display area,
the non-display area including a second area at an end of the substrate and a bending area at which the display device is bendable, the bending area between the first area and the second area;
a first wire disposed on the substrate in the first area, the first wire connected to the display area;
a second wire disposed on the substrate in the second area, the second wire spaced apart from the first wire in the first area;
a protection layer disposed on the first wire in the first area, in the bending area and on the second wire in the second area, a first contact hole and a second contact hole defined in the protection layer and respectively exposing the first wire and the second wire; and
a connection wire on the protection layer, the connection wire connected to the first wire in the first area at the first contact hole, such connection wire extended from the first area to traverse the bending area, such extended connection wire connected to the second wire in the second area at the second contact hole,
wherein
the connection wire includes a plurality of conductive layers contacting each other, the plurality of conductive layers including a same material, and
the same material of the plurality of conductive layers of the connection wire comprises aluminum or copper.

10. The display device of claim 9, wherein
the same material of the plurality of conductive layers of the connection wire comprises is aluminum with a grain size that is equal to or less than about 100 nanometers.

11. The display device of claim 9, wherein
the same material of the plurality of conductive layers of the connection wire comprises is copper with a grain size that is equal to or less than about 50 nanometers.

* * * * *